(12) United States Patent
Tarng

(10) Patent No.: US 7,939,227 B2
(45) Date of Patent: May 10, 2011

(54) METHOD AND STRUCTURE FOR FABRICATING DARK-PERIPHERY MASK FOR THE MANUFACTURE OF SEMICONDUCTOR WAFERS

(75) Inventor: Guang Yea (Simon) Tarng, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 311 days.

(21) Appl. No.: 12/163,533

(22) Filed: Jun. 27, 2008

(65) Prior Publication Data
US 2009/0325080 A1    Dec. 31, 2009

(51) Int. Cl.
*G03F 1/00*   (2006.01)
*G03C 5/00*   (2006.01)

(52) U.S. Cl. ............................................ 430/5; 430/311

(58) Field of Classification Search .............. 430/5, 311, 430/394; 382/149
See application file for complete search history.

(56) References Cited

U.S. PATENT DOCUMENTS

| | | | |
|---|---|---|---|
| 6,110,624 A * | 8/2000 | Hibbs et al. | 430/5 |
| 2003/0044059 A1* | 3/2003 | Chang et al. | 382/149 |
| 2007/0207391 A1* | 9/2007 | Lee et al. | 430/5 |

* cited by examiner

*Primary Examiner* — Stephen Rosasco
*Assistant Examiner* — Rashid Alam
(74) *Attorney, Agent, or Firm* — Kilpatrick Townsend and Stockton LLLP

(57) ABSTRACT

A method for manufacturing an integrated circuit devices. The method includes providing a substrate, which includes an opaque film overlying the substrate, an overlying negative photoresist layer, a stop layer overlying the negative photoresist layer, and a positive photoresist layer overlying the stop layer. The method includes patterning the positive resist layer to form one or more window openings in the positive photoresist layer. The method also includes removing the exposed stop layer within the one or more window openings to expose a portion of the negative photoresist layer and patterning the exposed portion of the negative photoresist layer. The method includes developing the exposed portion of the negative photoresist layer and removing exposed portions of the opaque layer to expose an underlying portion of the substrate. The method further includes removing any remaining portions of the negative photoresist layer, stop layer, and positive photoresist layer to provide a patterned mask. The patterned mask is used for a manufacture of integrated circuits.

15 Claims, 6 Drawing Sheets

METHOD AND STRUCTURE FOR FABRICATING DARK-PERIPHERY MASK FOR THE MANUFACTURE OF SEMICONDUCTOR WAFERS

CROSS-REFERENCES TO RELATED APPLICATIONS

NOT APPLICABLE.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

The present invention is directed to integrated circuits and their processing for manufacture of semiconductor devices. More particularly, the invention provides a method for manufacturing a photolithography mask for the manufacture of advanced integrated circuits such as dynamic random access memory devices, static random access memory devices (SRAMs), application specific integrated circuit devices (ASICs), microprocessors and microcontrollers, Flash memory devices, and others.

Integrated circuits or "ICs" have evolved from a handful of interconnected devices fabricated on a single chip of silicon to millions of devices. Conventional ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of U.S. dollars to build. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed.

An example of such a limit is an ability to manufacture the masks that are used in performing lithography for the manufacture of integrated circuits. A commonly used mask is called a phase shift mask. Phase shift masks have been used to print feature sizes of few microns using interference patterns from illumination sources and positive photoresists. Unfortunately, conventional processes to manufacture phase shift masks have become difficult to perform in an efficient and accurate manner. For example, negative photoresists have been employed for making masks for devices of feature sizes of less than 0.18 microns. Although such negative photoresists perform better than positive photoresists, processing time is much longer. Often times, thirty to sixty percent of the negative photoresist should be exposed, which further adds to processing time. Additionally, conventional processes seem to be cumbersome and cause quality problems in the masks themselves. These and other limitations are described throughout the present specification and more particularly below.

From the above, it is seen that an improved technique for processing semiconductor devices is desired.

BRIEF SUMMARY OF THE INVENTION

According to the present invention, techniques for the manufacture of semiconductor devices are provided. More particularly, the invention provides a method for manufacturing a photolithography mask for the manufacture of advanced integrated circuits such as dynamic random access memory devices, static random access memory devices (SRAMs), application specific integrated circuit devices (ASICs), microprocessors and microcontrollers, Flash memory devices, and others.

In a specific embodiment, the invention provides a method for manufacturing a mask for integrated circuit devices. The method includes providing a substrate, e.g., glass plate. The substrate includes an opaque film overlying the substrate, an overlying negative photoresist layer, a stop layer (e.g., insulating layer) overlying the negative photoresist layer, and a positive photoresist layer overlying the stop layer. These layers form a sandwich structure. The method then patterns the positive resist layer to form one or more window openings in the positive photoresist layer, while maintaining protection of the underlying negative photoresist via etch stop layer. Preferably, the exposure time for the positive resist is opened up within a predetermined window. The method removes the exposed stop layer within the one or more window openings to expose a portion of the negative photoresist layer and patterns the exposed portion of the negative photoresist layer. The method includes a step of developing the exposed portion of the negative photoresist layer and removing exposed portions of the opaque layer to expose an underlying portion of the substrate. The method includes removing any remaining portions of the negative photoresist layer, stop layer, and positive photoresist layer to provide a patterned mask using a portion of the opaque layer. Alternatively, the patterned positive photoresist film is removed before patterning the negative photoresist film.

In an alternative specific embodiment, the invention provides a method for manufacturing integrated circuit devices. The method includes providing a substrate, which includes an opaque film overlying the substrate. The system also has an overlying negative photoresist layer, a stop layer overlying the negative photoresist layer, and a positive photoresist layer overlying the stop layer. The method includes patterning the positive resist layer to form one or more window openings in the positive photoresist layer. The method also includes removing the exposed stop layer within the one or more window openings to expose a portion of the negative photoresist layer and patterning the exposed portion of the negative photoresist layer. The method includes developing the exposed portion of the negative photoresist layer and removing exposed portions of the opaque layer to expose an underlying portion of the substrate. The method further includes removing any remaining portions of the negative photoresist layer, stop layer, and positive photoresist layer to provide a patterned mask. The patterned mask is used for a manufacture of integrated circuits. Alternatively, the patterned positive photoresist film is removed before patterning the negative photoresist film.

In yet an alternative specific embodiment, the invention provides a photo mask blank structure for integrated circuit device. The photo mask blank structure has a transparent substrate having a surface region and an opaque film overlying the surface region. A negative photoresist material is overlying the surface region. A stop layer is overlying the negative photoresist material. Preferably, portions of the stop layer and/or portions of the positive photoresist layer prevent any possibility of the negative photoresist from being exposed and damaged before patterning. The structure also has a positive photoresist material overlying the stop layer. Preferably, the structure is for the manufacture of a phase shift mask but can also be for other mask structures.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention can be applied to a variety of applications such as memory, ASIC, microprocessor, and other devices. Preferably, the invention provides a way to manufacture a half tone phase shift mask using fewer steps, which result in a more efficient process. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for the manufacture of semiconductor devices are provided. More particularly, the invention provides a method for manufacturing a photolithography mask for the manufacture of advanced integrated circuits such as dynamic random access memory devices, static random access memory devices (SRAM), application specific integrated circuit devices (ASIC), microprocessors and microcontrollers, Flash memory devices, and others.

A method for fabricating a mask structure according to an embodiment of the present invention is outlined as follows:

1. Provide a substrate, e.g., glass plate;
2. Form an opaque film (e.g., chrome) overlying the substrate;
3. Form a negative photoresist layer overlying the opaque film;
4. Form a stop layer overlying the negative photoresist layer;
5. Form a positive photoresist layer overlying the stop layer;
6. Pattern the positive resist layer to form one or more window openings in the positive photoresist layer without exposing the negative photoresist layer that is covered by the positive photoresist;
7. Remove the exposed stop layer within the one or more window openings to expose a portion of the negative photoresist layer;
8. Pattern the exposed portion of the negative photoresist layer, which has covered portions that are free from any damage from preceding processes;
9. Develop the exposed portion of the negative photoresist layer;
10. Remove the exposed portions of the opaque layer to expose an underlying portion of the substrate;
11. Remove any remaining portions of the negative photoresist layer, stop layer, and positive photoresist layer to provide a patterned mask using a portion of the opaque layer;
12. Use the patterned mask for the manufacture of integrated circuits; and
13. Perform other steps, as desired.

The above sequence of steps provides a method for fabricating a photolithography mask according to an embodiment of the present invention. As shown, such steps include use of both positive and negative photoresist films. Preferably, covered portions of the negative photoresist protect such portions of the negative photoresist to form a dark periphery mask. Further details of the present invention can be found throughout the present specification and more particularly according to the Figures described below.

Figure 1:
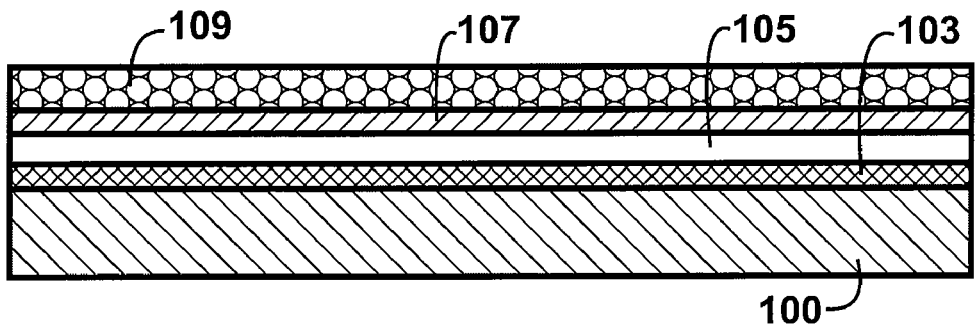
FIGS. 1 through 8 are simplified cross-sectional view diagrams illustrating a method of fabricating a phase shift mask according to an embodiment of the present invention.
Figure 2:
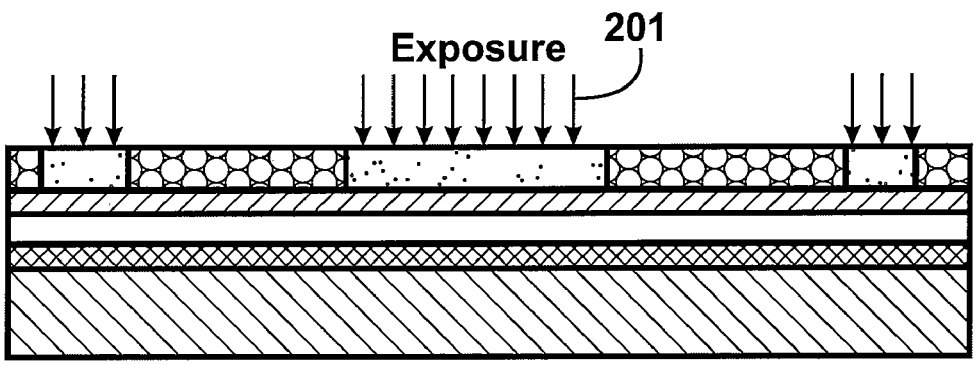
Figure 3:
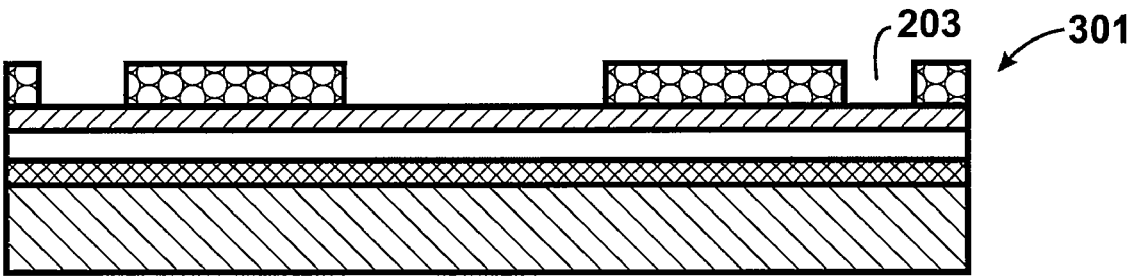

FIGS. 1 through 8 are simplified cross-sectional view diagrams illustrating a method of fabricating a phase shift mask according to an embodiment of the present invention. These diagrams are merely an example, which should not unduly limit the scope of the claims herein. One of ordinary skill in the art would recognize many variations, alternatives, and modifications. As shown, the method provides a quartz substrate 100. The quartz substrate includes a chromium film 103 overlying the substrate. Other films can also be used. The method forms a negative photoresist layer 105 formed overlying the chromium film. An insulating layer 107 and positive photoresist layer 109 are formed overlying the negative photoresist film. Depending upon the application various types of materials may be used for the insulating layer 107. Referring to FIG. 2, the method exposes 201 the positive photoresist layer. As shown, exposed regions 203 will be removed via development as illustrated in FIG. 3. Openings are formed in the photoresist layer for a mask pattern 301 as also illustrated.

Figure 4:
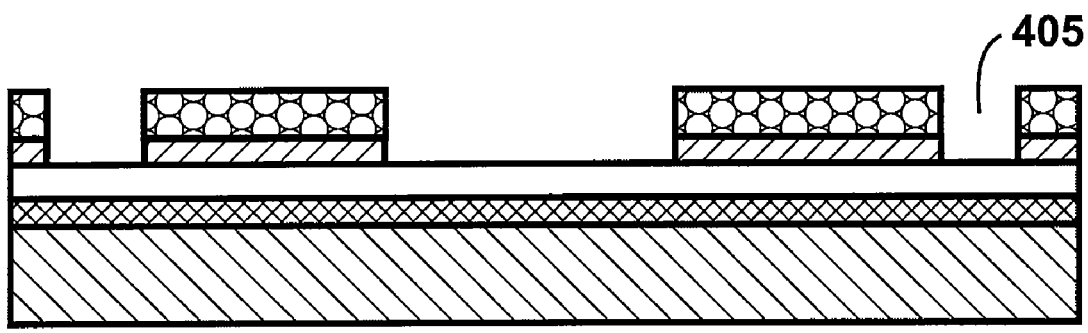
Figure 5:
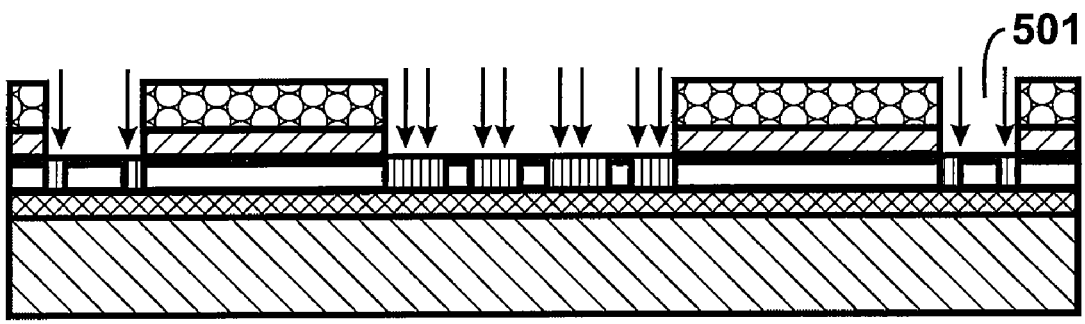
Figure 6:
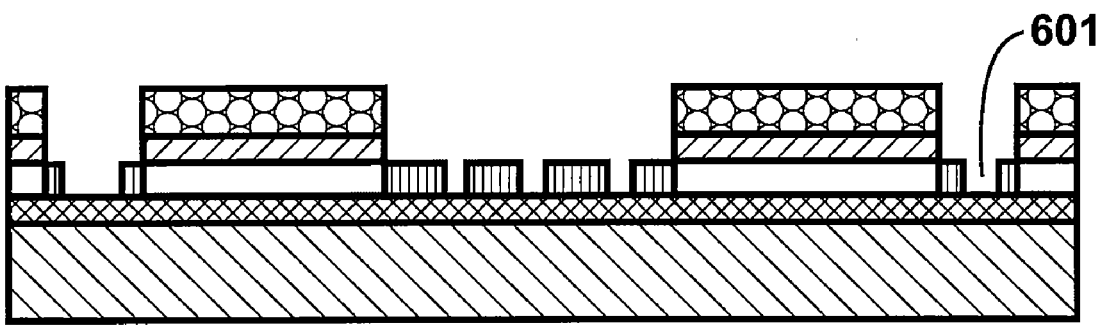
Figure 7:
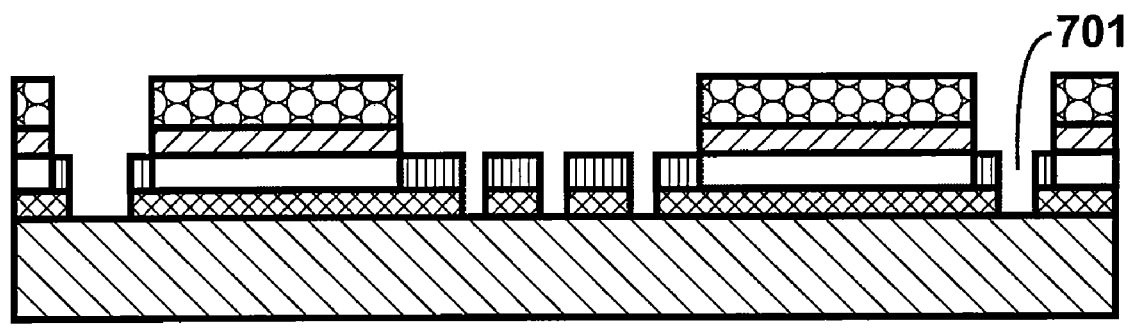
Figure 8:
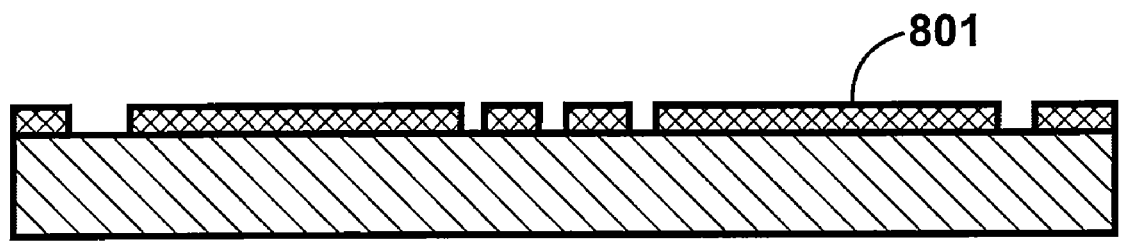
Figure 9:
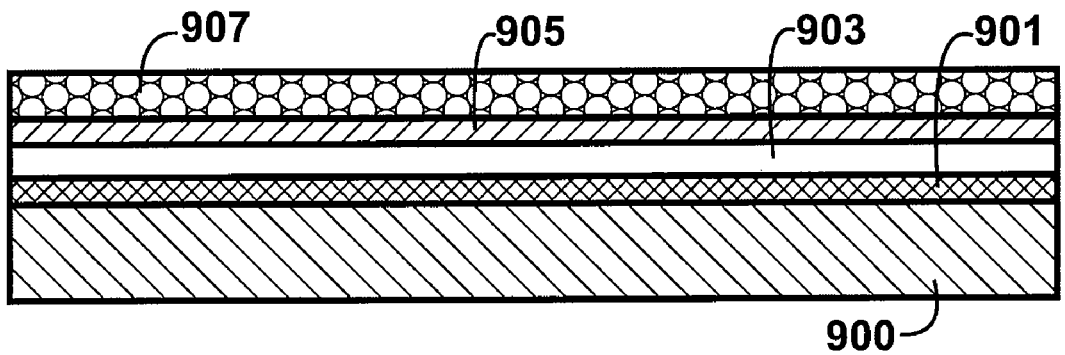
FIGS. 9 through 17 are simplified cross-sectional view diagrams illustrating an alternative method of fabricating a phase shift mask according to an alternative embodiment of the present invention

The method then etches exposed regions 405 of the insulating film through openings in the photoresist layer, as illustrated by FIG. 4. Preferably, dry etching techniques can be used. As merely an example, such dry etching techniques include, among others, plasma etching, reactive ion etching, etc. Plasma etching selectively removes the insulating film from the negative photoresist film. Here, the negative photoresist film acts as an etch stop layer. Alternatively, wet etching techniques can also be used. Referring to FIG. 5, the method exposes 501 the negative photoresist to form patterns. The patterns are developed and removed 601 as illustrated by FIG. 6. Preferably, the unpatterned portion of the positive photoresist film and/or etch stop layer protects unexposed regions of the negative photoresist. The method etches 701 the chromium film, which has been exposed, as illustrated by FIG. 7. Etching occurs without damaging the quartz substrate. The quartz substrate acts as an etch stop in the etching process of the chromium film. The etched chromium film is now patterned to form the mask pattern, which will be used in the manufacture of integrated circuits. Referring to FIG. 8, the method then strips 801 the photoresist films and insulating layer. Stripping often occurs using ashers employing an oxygen bearing plasma, which can be mixed with water. Of course, the particular stripping technique depends upon other factors. Depending upon the embodiment, there can be other variations, modifications, and alternatives. Further details of other methods and structures according to the present invention can be found throughout the present specification and more particularly below.

A method for fabricating a mask structure according to an embodiment of the present invention is outlined as follows:

1. Provide a substrate, e.g., glass plate;
2. Form an opaque film (e.g., chrome) overlying the substrate;
3. Form a negative photoresist layer overlying the opaque film;
4. Form a stop layer overlying the negative photoresist layer,
5. Form a positive photoresist layer overlying the stop layer;
6. Pattern the positive resist layer to form one or more window openings in the positive photoresist layer;
7. Remove the exposed stop layer within the one or more window openings to expose a portion of the positive resist layer;
8. Strip the positive resist layer;
9. Pattern the exposed portion of the negative photoresist layer;
10. Develop the exposed portion of the negative photoresist layer;
11. Remove the exposed portions of the opaque layer to expose an underlying portion of the substrate;
12. Remove any remaining portions of the negative photoresist layer, stop layer, and positive photoresist layer to provide a patterned mask using a portion of the opaque layer; and
13. Perform other steps, as desired.

The above sequence of steps provides a method for fabricating a photolithography mask according to an embodiment of the present invention. As shown, such steps include use of both positive and negative photoresist films. Preferably, covered portions of the negative photoresist protect such portions of the negative photoresist to form a dark periphery mask. Further details of the present invention can be found throughout the present specification and more particularly according to the Figures described below.

Figure 10:
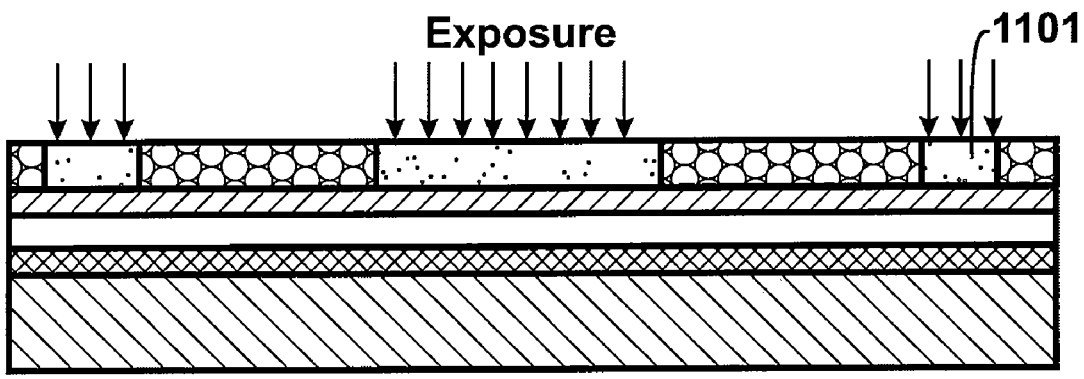
Figure 11:
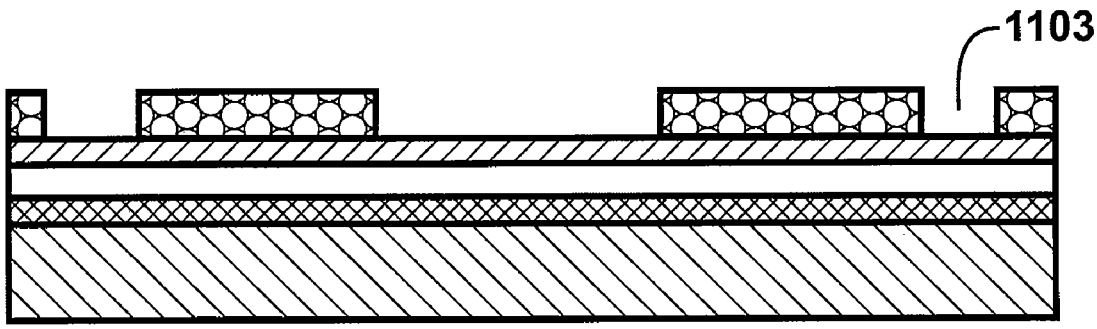

FIGS. 9 through 17 are simplified cross-sectional view diagrams illustrating a method of fabricating a phase shift mask according to an alternative embodiment of the present invention. These diagrams are merely an example, which should not unduly limit the scope of the claims herein. One of ordinary skill in the art would recognize many variations, alternatives, and modifications. As shown, the method provides a quartz substrate 900. The quartz substrate includes a chromium film 901 or other like films overlying the substrate. The method forms a negative photoresist layer 903 formed overlying the chromium film. An insulating layer 905 and positive photoresist layer 907 are formed overlying the negative photoresist film. Depending upon the application, various types of material for the insulating layer. Referring to FIG. 10, the method exposes 1101 the positive photoresist layer. As shown, exposed regions will be removed via development as illustrated in FIG. 11. Openings are formed in the photoresist layer for a mask pattern 1103 as shown in FIG. 11.

Figure 12:
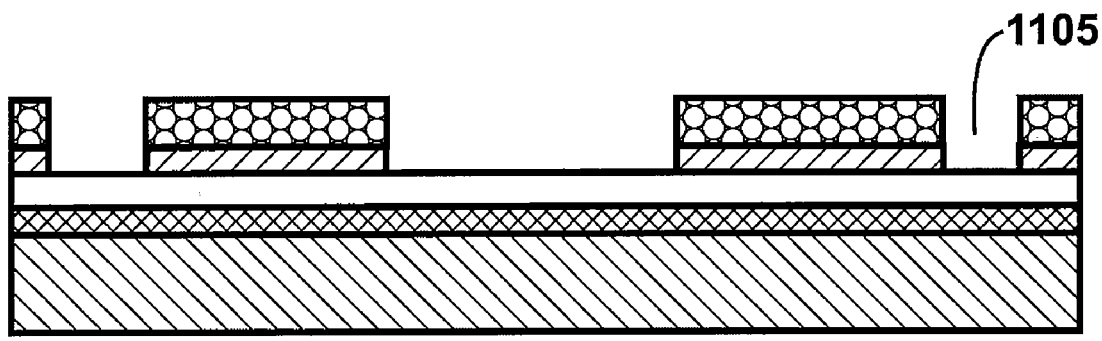
Figure 13:
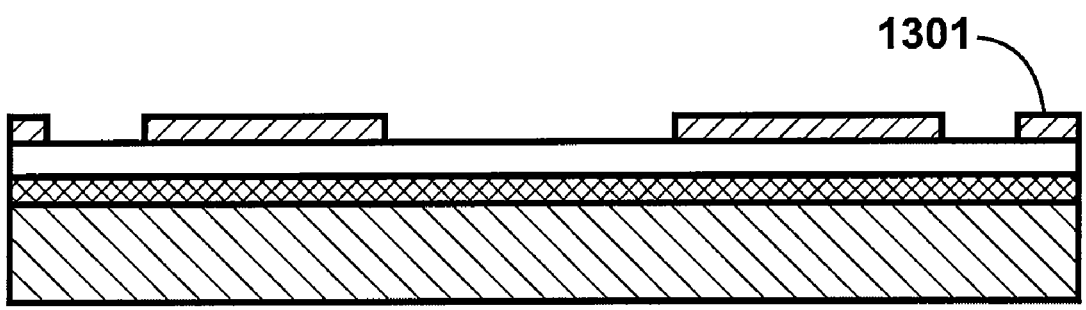
Figure 14:
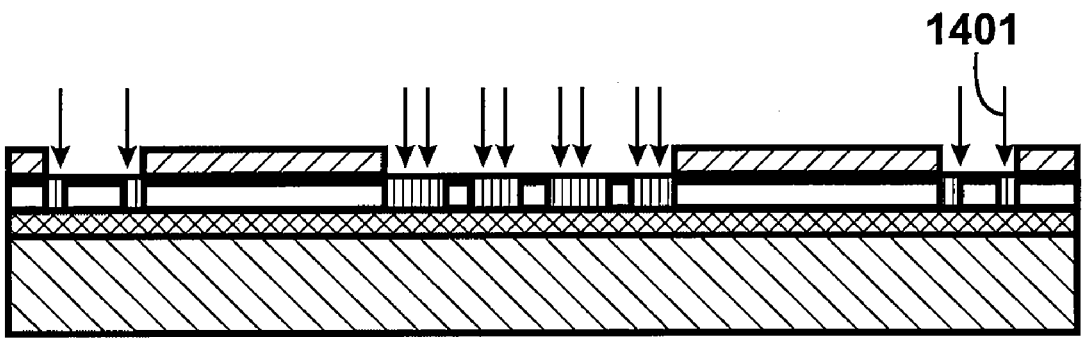
Figure 15:
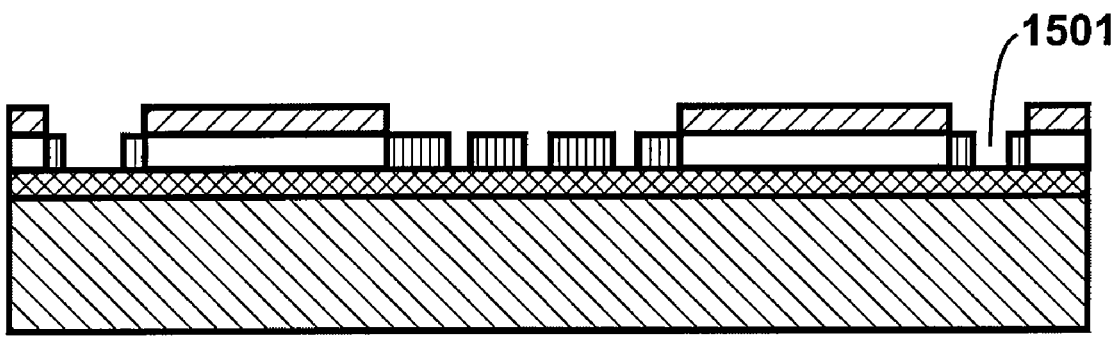
Figure 16:
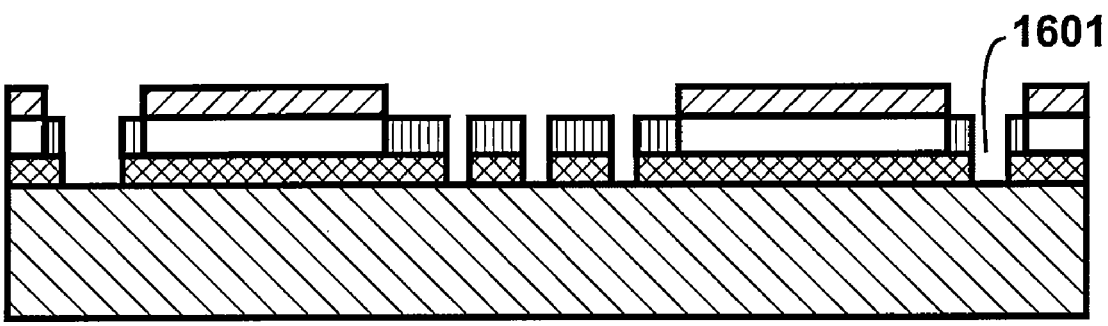
Figure 17:
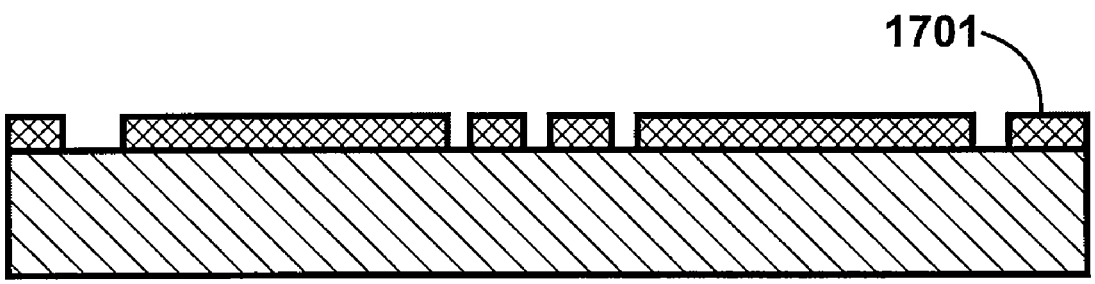

The method then etches exposed regions 1105 of the insulating film through openings in the photoresist layer, as illustrated by FIG. 12. Preferably, dry etching techniques can be used. As merely an example, such dry etching techniques include, among others, plasma etching, reactive ion etching, etc. Plasma etching selectively removes the insulating film from the negative photoresist film. Alternatively, wet etching techniques can also be used. Here, the negative photoresist film acts as an etch stop layer. The method then removes 1301 the positive photoresist using a stripping process or the like (See FIG. 13). As shown, the surface of the patterned layer is free from positive photoresist material. Referring to FIG. 14, the method exposes 1401 the negative photoresist to form patterns. Other portions of the negative photoresist layer have been protected via etch stop layer or the like. The patterns are developed and removed 1501 as illustrated by FIG. 15. The method etches 1601 the chromium film, which has been exposed, as illustrated by FIG. 16. Etching occurs without damaging the quartz substrate. The quartz substrate acts as an etch stop in the etching process of the chromium film. The etched chromium film is now patterned to form the mask pattern, which will be used in the manufacture of integrated circuits. Referring to FIG. 17, the method then strips 1701 the photoresist film and insulating layer. Stripping often occurs using ashers employing an oxygen bearing plasma, which can be mixed with water. Of course, the particular stripping technique depends upon other factors. Depending upon the embodiment, there can be other variations, modifications, and alternatives.

Although the above has been illustrated according to a specific embodiment, there can be other modifications, alternatives, and variations. It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing a mask for integrated circuit devices, the method comprising:

providing a substrate, the substrate including an opaque film overlying the substrate, an overlying negative photoresist layer, a stop layer overlying the negative photoresist layer, and a positive photoresist layer overlying the stop layer;

patterning the positive resist layer to form one or more window openings in the positive photoresist layer;

removing the exposed stop layer within the one or more window openings to expose a portion of the negative photoresist layer while other portions of the positive photoresist layer protect unexposed regions of the negative photoresist layer;

patterning the exposed portion of the negative photoresist layer while protecting the other portions of the unexposed regions of the negative photoresist layer;

developing the exposed portion of the negative photoresist layer; and removing exposed portions of the opaque layer to expose an underlying portion of the substrate; and removing any remaining portions of the negative photoresist layer, stop layer, and positive photoresist layer to provide a patterned mask.

2. The method of claim 1 wherein the substrate is quartz.

3. The method of claim 1 wherein the removing the exposed portions of the opaque layer comprises a wet etching process or dry etching process.

4. The method of claim 1 wherein the exposed portion of the opaque layer has a characteristic length of less than 0.72 microns.

5. The method of claim 1 wherein the stop layer is an insulating layer.

6. The method of claim 1 further comprising using the mask in a manufacture of a semiconductor integrated circuit.

7. The method of claim 1 wherein the patterning the exposed portion of negative photoresist comprises selectively scanning a laser beam or an electron beam onto the exposed portion of the negative photoresist.

8. The method of claim 1 wherein the patterning is a raster scan or a vector scan.

9. A method for manufacturing an integrated circuit devices, the method comprising:
   providing a substrate, the substrate including an opaque film overlying the substrate, an overlying negative photoresist layer, a stop layer overlying the negative photoresist layer, and a positive photoresist layer overlying the stop layer;
   patterning the positive resist layer to form one or more window openings in the positive photoresist layer, the one or more window openings having a dimension;
   removing the exposed stop layer within the one or more window openings to expose a portion of the negative photoresist layer;
   patterning the exposed portion of the negative photoresist layer;
   developing the exposed portion of the negative photoresist layer; and
   removing exposed portions of the opaque layer to expose an underlying portion of the substrate; and
   removing any remaining portions of the negative photoresist layer, stop layer, and positive photoresist layer to provide a patterned mask; and
   using the patterned mask for a manufacture of integrated circuits.

10. The method of claim 9 wherein the substrate is quartz.

11. The method of claim 9 wherein the exposed portion of the substrate having a width of less than 0.72 microns.

12. The method of claim 9 wherein a portion being covered by the positive photoresist is about 30 percent of a surface region of the substrate.

13. The method of claim 9 wherein the removing of any remaining portions of the negative photoresist layer, stop layer, and positive photoresist layer to provide a patterned mask are performed separately.

14. The method of claim 9 wherein the stop layer is an etch stop layer.

15. The method of claim 9 wherein the stop layer is a separator between the negative photoresist layer and the positive photoresist layer.

* * * * *